United States Patent [19]
Cowans et al.

[11] Patent Number: 4,549,146
[45] Date of Patent: Oct. 22, 1985

[54] SYSTEMS AND METHODS FOR COMPENSATING FOR ELEMENT NONLINEARITIES IN ELECTRONIC CIRCUITS

[76] Inventors: Kenneth W. Cowans, 17520 Greenleaf St., Encino, Calif. 91316; M. Owen Bennett, 5913 Etiwanda Ave. #7, Tarzana, Calif. 91356

[21] Appl. No.: 501,194

[22] Filed: Jun. 6, 1983

[51] Int. Cl.[4] .............................................. H03F 1/26
[52] U.S. Cl. ...................................... 330/149; 330/85; 330/110; 330/260
[58] Field of Search ................. 330/85, 110, 149, 162, 330/260, 151; 332/37 D

[56] References Cited

FOREIGN PATENT DOCUMENTS 474904 11/1975 U.S.S.R. ............................. 330/149

OTHER PUBLICATIONS

Soliman, Ahmed M., et al., "Active Compensation of OpAmps", *IEEE Trans. Ckts. and Systems*, vol. CAS-26, No. 2, Feb. 1979, pp. 112–117.

Primary Examiner—James B. Mullins
Assistant Examiner—Steven J. Mottola
Attorney, Agent, or Firm—Fraser and Bogucki

[57] ABSTRACT

The distortion effects introduced in a complex multifrequency wave by parametric variations in individual active elements arising from signal and power supply variations in a circuit, such as an audio amplifier, are compensable through the use of replicas of the active elements, and the generation of a feedback signal incorporating comparable distortion. By high gain amplification of the feedback signal in a differential amplifier receiving an input signal that is not comparably distorted a comparison signal is derived containing distortion components. The comparison signal is used in a feedforward path which includes the circuit that is subjected to parametric variations in a sense to cancel the introduced distortions.

10 Claims, 5 Drawing Figures

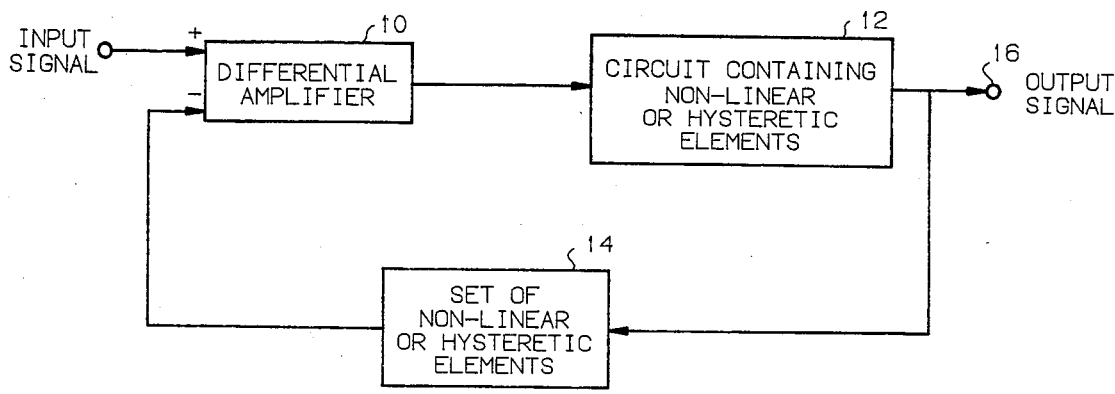
FIG. 1
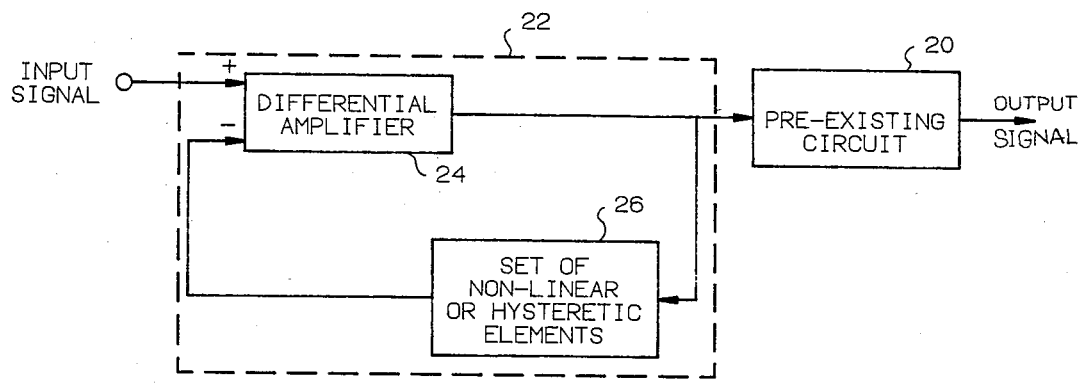
FIG. 2
FIG. 3
HYBRID π MODEL
FOR TRANSISTOR
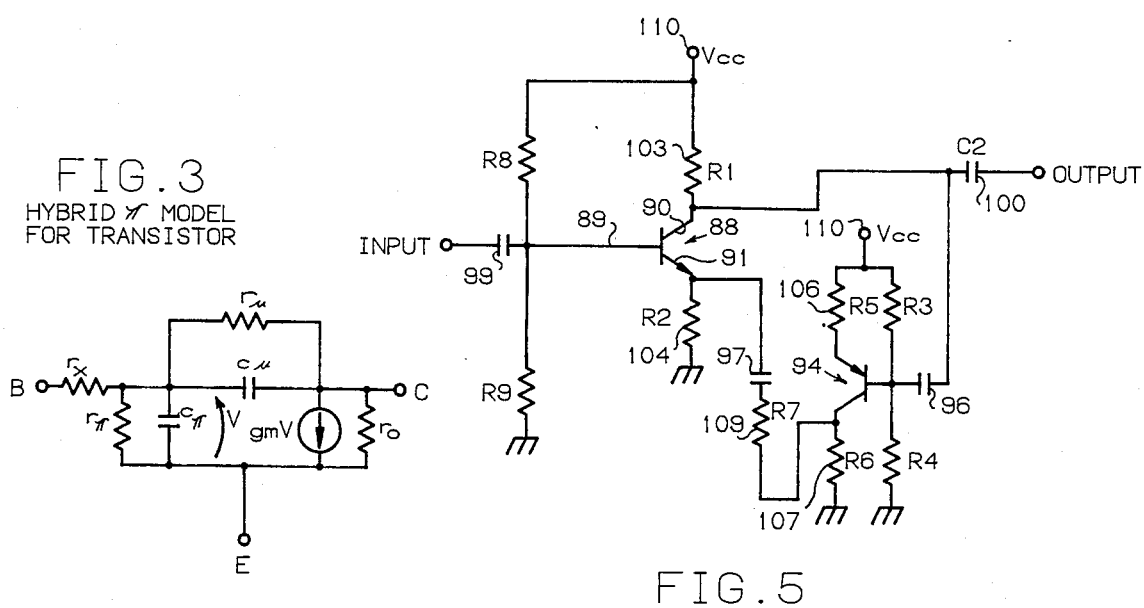
FIG. 5

SYSTEMS AND METHODS FOR COMPENSATING FOR ELEMENT NONLINEARITIES IN ELECTRONIC CIRCUITS

BACKGROUND OF THE INVENTION

Since the introduction of solid state devices (transistors, diodes, etc.), there has been a revolution in electronic products and devices. Almost all such items are manufactured using the latest in solid state electronic technology up to and including very large scale integrated circuits. Such devices are relatively inexpensive and contain up to hundreds of active devices on a very small chip.

The trend in design of almost all electronic circuits has been swept along with this revolution. For example, in the audio electronics industry, it is estimated that in excess of 99% of the electronic units are manufactured using solid state devices. Only a small fraction of the units are built using vacuum tube circuits.

Within the audio reproduction industry, however, there is a group of manufacturers and customers who are interested in the highest quality of audio reproduction that can be achieved. Within this group a paradox has arisen; there is a consensus of opinion that circuitry employing vacuum tubes reproduce sound with superior quality compared to circuitry employing solid state devices, even though conventional laboratory measurements which are used to compare performance yield data leading to the conclusion that solid state circuits perform better. Nonetheless, audiophiles with the financial means available often insist upon vacuum tube preamplifiers and amplifiers despite their bulk and higher cost.

Applicants have worked extensively in the field of high fidelity sound reproduction and in the elimination of spurious emanations in loudspeaker reproduced sound, as evidenced by U.S. Pat. No. 4,340,778 entitled "Acoustic Systems". Minimization of these spurious emanations has enabled identification of other disturbing factors, particularly those arising from different types of electronic system circuit topologies. It became evident from ongoing studies that numerous subtle influences affect an audio system that are inconstant in nature and derived from internal operative factors that have heretofore been accepted as necessary limitations on performance, given the need for reasonable system economy. The inconstant deviations of sound are perceptible to the human ear because of the great capabilities and subtlety of that organ, even though typical measuring instruments cannot quantify audible effects which are several orders of magnitude less than the dominant signal, and which vary dynamically in accordance with a complex multifrequency wave.

Applicants themselves first confronted this problem in the paradox between tube and solid state electronic devices when investigating aberrations in sound reproduction systems arising from specific devices. The investigations led to hypothesizing obscure phenomena in the devices and then performing tests to verify the hypotheses. Invariably, the effects yielded from the experiments could not be measured using conventional techniques, yet the effects could be reliably detected in sonic reproduction by knowledgeable and attentive listeners. Applicants subsequently devised techniques, described in U.S. patent application Ser. No. 467,434, filed Feb. 17, 1983 and entitled "Systems And Methods For Signal Compensation", for improving sound quality by counteracting the effects of nonlinearities in certain sound reproducing equipment. Thus, as disclosed in the previously filed application, immeasurable but nonetheless audible distortions arising from operation of a magnetic phonograph cartridge circuit can be eliminated by replication of hysteretic elements in a way which compensates for signal dependent nonlinearities.

It is recognized that the electronic device marketplace demands a level of total product performance (life, reliability, ruggedness, power drain, portability) that precludes the use of vacuum tube technology in all but a few cases. Thus, for instance, any development which would allow the use of conventional solid state circuits and devices while also attaining the level of quality of vacuum tube audio reproduction would be of significant economic value. Such an expedient could be applicable wherever circuit performance requirements entail the accurate reproduction of complex multifrequency waveforms. These areas include not only audio reproduction but also other applications such as video reproduction and thermal image reproduction.

The design of circuits for purposes of accurately reproducing signal waveforms generally deals with areas such as long and short term gain stability, signal-to-noise ratio, frequency and phase response and distortion of various types. In this pursuit, there are several conventional techniques which are used to reach the design goals set forth. Among these are the standard techniques utilizing feedback.

Local feedback can be used with any valve (transistor or tube) to minimize the nonlinear nature of its input-output transfer characteristic. This tends also to linearize the open loop nature of a combination of valves. To further improve the overall linearity of a combination of valves, the technique of overall negative feedback is employed to achieve the long and short term gain stability requirements. Feedforward is also employed, and it is to be noted that U.S. Pat. No. 4,379,994 suggests the inclusion of an error-generating device to correct for some characteristics of an amplifier, based upon a feedforward circuit and another amplifier. The errors involved, however, are the gross noise and distortion components for which typical compensating networks suffice as the error generator, and not the inherent internal nonlinearities of elements themselves.

Beyond the use of the conventional techniques, improvement in performance is generally achieved by improving the quality of the components—valves, capacitors, resistors, inductors, transformers, etc. The level in improvement which can be achieved in this fashion is generally limited by economic factors. Highest quality components often are disproportionately expensive relative to the incremental quality improvement that is achieved.

SUMMARY OF THE INVENTION

Methods and systems in accordance with the invention cancel the effects of substantially immeasurable phenomena in electronic circuits by using elements which replicate in whole or in part parametrically variable elements within the circuit assembly, and also independently generating a feedback waveform containing similar distortions which is then used in correcting the distorted signal. Distortions introduced by individual active devices subject to parametric variations are thereby compensated, thus idealizing the output, despite signal and power supply induced effects.

In general, the technique employs the use of a differential amplifier in which an input signal is compared to a signal from a replica feedback path. The difference signal may be amplified with high gain through a set of circuit elements which exhibit undesirable parametrically variable or hysteretic characteristics, and delivered to both the output of the circuit and the input to the replica feedback circuit. The feedback path is configured to contain an assembly of elements with similar parametrically variable and hysteretic characteristics to those in the feedforward path, and to be subject to like power supply variations. The resultant output is a signal which is substantially free of the effects of the immeasurably small effects of parametric variations and hysteresis in the elements in the feedforward signal path. More specifically, parametric variations and hysteretic effects in active devices and capacitors that arise from signal and power supply variation excitations are replicated in essential respects in deriving a signal which is used in error-correcting fashion.

The invention also allows for compensation of the immeasurably small anomalies in devices in an existing circuit, such as an amplifier. In this case, an input signal is compared to a signal from a feedback path in a differential amplifier. The difference between the two signals is amplified with high gain and delivered to the circuit output and to the input of the feedback path. The feedforward path is comprised of high quality elements which are essentially defect-free. The feedback path, however, contains an assembly of elements which display similar parametrically variable and/or hysteretic characteristics as the circuit being corrected. The high gain differential amplifier causes the signal difference between the feedback path and the input to be reduced to near zero. Thus the circuit output signal displays the inverse signal anomaly as that signal at the output of the feedback path. Thus, when the signal that is processed is from the circuit displaying an anomaly, the anomaly is cancelled out at the output of the correction circuit. Alternatively the compensating distortion may be inserted prior to application to the input of the circuit. In this case, the signal is predistorted in an inverse fashion to compensate for the signal and power supply induced parametric variations which arise in the existing device. Thus, when the signal emerges from the output of the existing device, it will be a substantially faithful reproduction of the original input signal.

BRIEF DESCRIPTION OF THE DRAWINGS

A better understanding of the invention may be had by reference to the following description taken in conjunction with the accompanying drawings, in which:

FIG. 1 is a block diagram of a system for compensation of a circuit containing parametrically variable or hysteretic elements;

FIG. 2 is a block diagram of a system for pre- or post-compensation of another circuit;

FIG. 3 is a schematic diagram of a circuit equivalent for a transistor;

FIG. 5 is a circuit diagram of a compensated single gain stage in accordance with the invention.

DETAILED DESCRIPTION OF THE INVENTION

Figure 4:
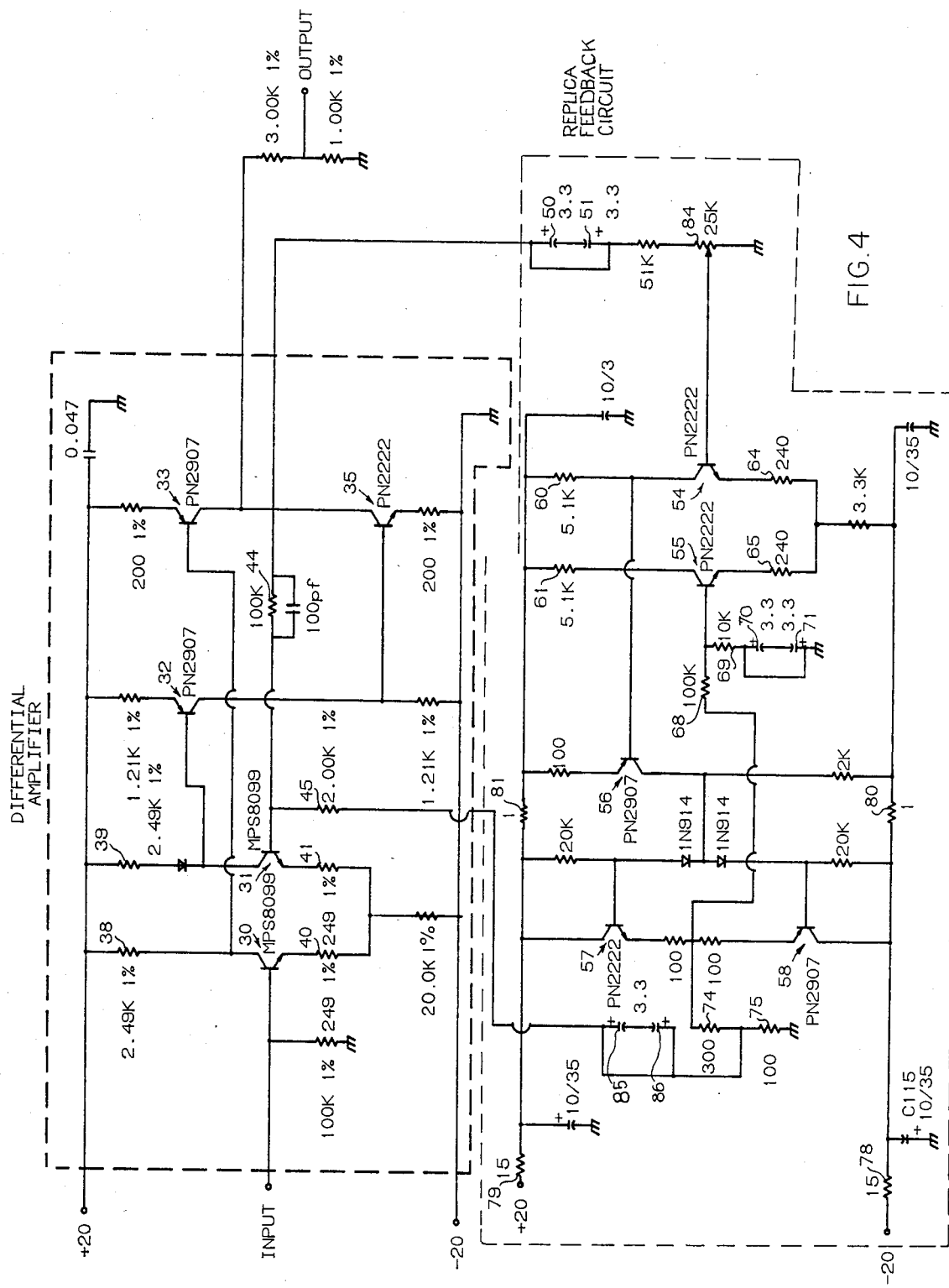
FIG. 4 is a circuit diagram of an amplifier compensated in accordance with the invention.

The effect of signal induced parametric variations in signal processing, particularly in the presence of complex multifrequency signal waveforms, is to generate harmonics and intermodulation products which are not in the original signal waveforms. In modern electronic circuit design, the gross non-linearities of the active elements used are well understood and are compensated by well known circuit techniques typically involving negative feedback of an overall or local type. However, in high quality audio reproduction, when differences readily perceptible to the human ear are detectable between devices (e.g., preamplifiers and amplifiers) the differences may not be measurable using state of the art instrumentation equipment. One is led to believe that higher order effects are involved which heretofore have either been overlooked, considered unimportant, or are correctable only at inordinate expense at the component level.

Experimental evidence developed by applicants indicates that these higher order effects occur in passive elements associated with the signal path (capacitors, switch connector contacts, wiring, etc.) and with active elements (tubes, transistors, integrated circuits). The inherent nature of some electrical elements involves signal induced parametric variations in one or several of the element characteristics. These variations include phenomena such as hysteresis in which the instantaneous dynamic characteristic of element depends on the state of the signal or exciting force in prior time. There is also the non-hysteretic simple variation in which the instantaneous characteristics depend only on the instantaneous signal or exciting force. The higher order effects which are present and correlate with experiments in the audio field are inherent in most of the components and transducers and can be at best only diminished to a low but still perceptible value; this reduction is achieved usually with disproportionately increasing cost. In some instances, no matter what the cost, perfection in the sense of absence of disturbing effects is theoretically unachievable because perfect components are also unachievable.

The devices of primary interest herein are the valves (tubes or transistors) and capacitors used to couple signals between stages. The capacitors used in all electronic equipment display the hysteretic effect of dielectric absorption to a variable degree depending upon the dielectric medium used. The characteristics of most dielectrics are such as to simulate to a first approximation a capacitance in series with a comparatively small resistance. The charge on the capacitor does not attain its maximum value the instant a potential is applied, but the charging current may be appreciable over a period of minutes. Likewise, the charge does not flow off instantaneously when the terminals are shorted; there is a certain time lag associated with the dielectric which gives rise to a hysteresis phenomenon. If the instantaneous value of the charge is plotted for a complete period as a function of the voltage across the capacitance, the path is not the same going from a first to a second point as going from the second point back to the first. The area between the two curves represents the energy dissipated in the dielectric in one cycle. In the approximate equivalent circuit the effective series resistance $R_s$ decreases with frequency in such a way that the product R·C remains essentially constant over a very large range of the variable ($\omega = 2\pi \times$ frequency). (Reference: Gaylord P. Harnwell, *Principles of Electricity and Magnetism*, 2nd Edition, McGraw-Hill Book Company, Inc., New York, N.Y., 1949). The nonlinear effect of the frequency variable series resistance causes intermodulation products in complex waveforms with multifrequency content, and can be discerned in audiophile quality sound reproduction equipment.

Applicants have found that one major difference between tube and solid state circuits is the relative breakdown voltages on the capacitors normally used. In the tube circuits the breakdown voltages on the capacitors are often an order of magnitude higher than on those used in solid state circuits because the supply voltages are that much higher in voltage level. Testing bears out the fact that signal induced effects on capacitors are greatly reduced when higher voltage breakdown dielectric devices are used. However it is not practical to use the much physically larger high voltage capacitors for solid state circuits, by reason of size disparities alone.

For capacitors which are commercially available, the stated ranges of equivalent series resistance (at self resonance) vary over several orders of magnitude. For instance, tantalum electrolytic capacitors have an equivalent series resistance on the order of 500 milliohms while aluminum electrolytic and film electrolytic (such as polypropylene or polystyrene) capacitors have equivalent series resistances on the order of 50 and 5 milliohms respectively. In audio listening tests, there is a correlation between better fidelity of reproduction with lower equivalent series resistance; cost also increases significantly with lower equivalent series resistance. Yet in the tests conducted, the circuit impedances were generally high (on the order of 50,000 ohms); thus the variations encountered are on the order of 1 part per million and are virtually immeasurable with standard test equipment.

In the case of the capacitor there are parametric variations which are directly signal induced as a result of the signal modulating the equivalent series resistance. However, there is also the case of a class A stage amplifier wherein not only the signal is transmitted through a capacitor coupled to the collector of a transistor (or the anode of an electron tube), but the supply voltage also appears across the capacitor. Thus, if there is a time-varying signal on the power supply voltage there will also be an intermodulation between the primary signal and the signal on the power supply voltage. The signal on the power supply can be as a result of ripple and also as a result of non-zero power supply output impedance wherein the signal voltage on the power supply is a result of the time-varying current being drawn from the power supply.

Analysis of the valve (transistor or tube) involves quite complex phenomena. In the case of the transistor, there are many characteristics which are variable and are dependent on the operating conditions of the device. As shown in FIG. 3, a transistor can be conveniently modeled for small signal applications, with the terminal B corresponding to the base terminal of the transistor, the terminal C to the collector, and the terminal E to the emitter. This model and the dependence on operating conditions is discussed thoroughly in chapter 4 of *Elementary Circuit Properties of Transistors* (by Searle et al, 1964, Wiley & Sons, Inc., New York).

Briefly, the most important parameters of the transistor which vary with operating conditions are the input impedance, the device gain, output impedance and feedback capacitance. The base resistance $(r_x + r_\pi)$ (generally the input in an amplifier stage) will vary with collector-to-emitter current $(I_c)$. The base capacitance $(C_\pi)$ will vary with the base-to-emitter $V_E$ voltage. The feedback capacitance $(C_\mu)$ and the output resistance $(r_o)$ depend on the collector-to-emitter voltage $(V_{CE})$. The mutual transconductance $(G_m)$ will depend on the collector current $(I_c)$ and the collector-to-emitter voltage $(V_{CE})$.

The substance of the preceding discussion is to point out that there are a number of parameters which will vary, even a minute amount, with primary signal and with secondary signal from the power supply voltage variations.

Techniques in accordance with the invention are illustrated in general in the block diagram of FIG. 1, which may represent a typical audio preamplifier or amplifier system. The technique illustrated provides an overall circuit that is substantially free of all adverse effects of signal and power supply induced parametrically variable and hysteretic effects. The input signal at the positive input to a differential amplifier 10 is compared to a feedback signal at the negative input to the amplifier 10. A feedforward path, through a circuit 12 containing parametrically variable or hysteretic elements, has high gain even though the signal contains traces of undesired effects from the elements within the circuit 12. The feedback path also, however, contains a set of active and passive replica elements 14 which exhibit similar undesirable characteristics as in the feedforward path. Thus, the high gain differential amplifier 10 causes a signal to be generated at the negative input from the feedback circuit which is substantially identical to the circuit input signal at the positive input. The signal developed at the output of the differential amplifier 10 is distorted inversely to the distortion that is imposed on the signal when it passes through the feedforward path that contains the parametrically variable and hysteretic effects. Thus when the signal reaches the system output 16, it is a substantially faithful reproduction of the input signal. Further details of the relationships involved in the use of high gain are set forth in the previously filed U.S. application Ser. No. 467,434, in which magnetic and passive elements are replicated. The present invention, however, deals with what may be termed microoperation within a circuit, typically but not necessarily an amplifier, itself. The parametric variations are so small and of such dynamic character that the use of local compensation is not feasible. However, as previously noted, the contributions to distortion are discernible by the ear.

The technique also has application for correction of pre-existing inferior quality circuits 20 ahead of or after a compensating circuit 22 as shown in FIG. 2. Thus a purchased amplifier or preamplifier can be improved by serial coupling of a compensating circuit in accordance with the invention. In this application of the invention, an input signal may be fed into the positive input of a differential amplifier 24. The signal in the feedback path from the output of the differential amplifier 24 is fed into the negative input of the amplifier, which amplifies with high gain the difference between the signals at the two inputs. The replica feedback path contains a set of elements 26 which exhibit the same type of signal and power supply induced parametrically variable or hysteretic characteristics as the circuit 20 being corrected. The differential amplifier 26 tends to make the signal at the negative input substantially equal to the input signal at the positive input. The signal through the feedback path undergoes the same minute aberration as occurs in the circuit 20 being corrected. Since the signal from the replica feedback path is substantially equal to the input, then the signal at the circuit output is affected in the inverse sense to the aberration generated in the replica feedback path. The pre-existing circuit 20 may be coupled to the output (as shown) or to the input of the compensating circuit 22.

If the circuit for which correction is desired has a transfer function (including nonlinearities) given by $$\frac{E_{out}(s)}{E_{in}(s)} = A(s)$$

and the correcting circuit has a feedback path which has a transfer function which is substantially equal to A(s), then the two circuits in cascade will have the effect of substantially cancelling the undesired effects since the transfer function of the correcting circuit is substantially equal (or proportional) to $A(s)^{-1}$ and $A(s) \cdot A(s)^{-1} = 1$ (or a constant).

The circuit shown in FIG. 4 is the preferred exemplification of the invention when a cancellation is desired for the effects generated in a pre-existing audio preamplifier and/or power amplifier, and thus is a realization of the concept as shown in FIG. 2. In the circuit shown transistors 30, 31, 32, 33 and 34 form the differential amplifier 24 with high gain. The feedforward channel comprises a high quality discrete operational amplifier, of which the input stage is formed by transistors 30 and 31 in a differential configuration. The open loop gain of this stage is limited to a value of 10 by the selection of the collector resistors 38 and 39 compared to the emitter resistors 40 and 41. A transistor 32 is used simply as a unity gain stage and a level shifter in order to provide drive of the proper amplitude and phase to output transistor 34. The output stage of the feedforward channel is formed by transistors 33 and 34 which operate in a push-pull complementary grounded emitter stage. The overall gain of the feedforward stage is limited by a feedback resistor 44 and the input resistor 45. This limits the open loop gain of the feedforward stage to a value of 50.

The output from the feedforward stage is capacitively coupled into the input to the feedback circuit. The capacitors 50, 51 chosen for the coupling are electrolytic capacitors which exhibit a high degree of hysteresis. These capacitors 50, 51 represent the coupling capacitor which might be found on the input stage of either a preamplifier or a power amplifier.

The replica feedback circuit is an active one formed by transistors 54, 55, 56, 57 and 58. The circuit topology used in the feedback circuitry is representative of that which might be found in a typical preamplifier or power amplifier. Note that the input stage is a differential configuration of transistors 54 and 55. The gain in this stage is set to a value of 20 by collector resistors 60 and 61 and the emitter resistors 64 and 65. This type of input stage is typical of most audio reproduction equipment at the high level inputs. Transistor 56 is a class A stage which performs the second stage of voltage gain after the input differential amplifier stage. Output transistors 57 and 58 form an emitter follower push-pull output stage which is also typical of most preamplifier and power amplifier output stages. The gain of the feedback circuit is set by the feedback resistances 68 and 69. Note that the feedback resistance ratio at DC is such that the gain of the feedback circuit is unity; however, at frequencies above a value of approximately 10 Hz, the resistance to ground through the capacitor network is approximately 10K ohms. This sets the gain through the feedback circuit to a value of approximately 11. Again capacitors 70 and 71 are chosen to be electrolytic capacitors to provide whatever parametric or hysteretic effect would normally be found in a circuit of this type. This type of feedback configuration is again typical for preamplifier and power amplifiers.

The output signal from the emitter-follower push-pull stage in the feedback circuit is loaded into a resistance formed by resistors 74 and 75. These values are relatively low in order to simulate the load which might be placed on a power amplifier. The signal from the output of the feedback stage is capacitively coupled into the feedforward differential amplifier 24 at the inverting (minus) differential input.

The power for the feedback circuit is provided through networks which allow for the addition of varying impedance in the form of resistances 78, 79, 80 and 81. This is done specifically to allow for the signal induced variations which occur from signal current flowing from relatively high impedance power supplies. Thus the signal induced currents will cause varying voltages on the power supply which will in turn modulate the parameters of the active devices and also the capacitors in the power supply.

The potentiometer 84 is included in order to allow for varying the signal level handled in the feedback circuit and thus to vary the amount of effect which is created by the signal passing through the feedback circuit.

The feedforward path of this circuit is formed by differential amplifier 24. This portion of the overall circuit is designed to be substantially error free by use of large amounts of local feedback in each active stage and also by use of a well-regulated low-impedance source of power.

The replica feedback path includes all of the elements which are affected by the signal and by signal induced variations in the power supply. The signal in the feedback path will also undergo alteration due to dielectric absorption in the coupling capacitors 50, 51, 70, 71, 85 and 86; the signal will also undergo alteration in the replica feedback circuit due to parameter modulation in the active elements from both signal and from power supply voltage variations induced by signal current flow.

The nature of the feedforward differential amplifier is to make the signals from the replica feedback circuit substantially equal to the original input signal. For this to occur, the signal at the feedforward circuit output (which is also the input to the replica feedback circuit) must be modified in an inverse sense compared to the processes this signal will undergo in the replica feedback circuit so that the resultant replica circuit output will be substantially identical to the circuit input.

In consequence of replication of the active and capacitive elements and derivation of a compensating signal in the described fashion, certain distortions are removed from the signal passed through the circuit. In high quality audio amplifiers such distortions, although minute and essentially immeasurable in signal form, are nonetheless discernible by the human ear. In an audio amplifier, therefore, it is not necessary to revert to an electron tube design to reduce intermodulation distortion, inasmuch as comparable high fidelty can be obtained by the described compensation.

The circuit shown in FIG. 5 is an example of the general concept of FIG. 1 as applied to a simple single class A gain stage. In this case, compensation is provided for the coupling capacitors, transistor, and power supply effects.

Within the input stage formed by a transistor 88, which is the stage being compensated, the differential amplifier action is accounted for by the fact that when a signal is injected at the base 89 of the transistor 88 the signal at the collector 90 is inverted compared to the signal at the input. The signal is injected at the emitter 91 of the transistor 88. The signal is non-inverted at the output compared to the signal injected at the emitter 91. Thus the composite signal at the collector 90 of the transistor is the difference between the signals at the base 89 and the emitter 91.

The feedback circuit is formed by a second stage transistor 94. The signal is coupled into and out of the feedback circuit via capacitors 96 and 97 which are electrolytic devices and are used to compensate the effects of electrolytic coupling capacitors 99 and 100 at the overall circuit input and output respectively. Resistors R1 and R2, designated 103 and 104 respectively are each in circuit with the first transistor 88 at the collector 90 and emitter 91. Similarly R5 and R6 resistors (106 and 107) are coupled to the emitter and collector of the second transistor 94, while the R7 resistor 109 is in circuit with the capacitor 97 in the feedback path. Power is derived from a source 110 in circuit with the transistors.

The gain of the first stage transistor 88 for signals injected at the base is given by the relation $A_1 = R1/R2$. The gain of the first transistor 88 for signals injected from the collector of the second stage transistor 94 is given by the relationship $A_2 = R1/R7$. The gain of the second transistor 94 for signals injected at its base is given by the relationship $A_2 = R6/R5$. The overall gain of the stage from input to output is given by the relationship $$A = \frac{\frac{R1}{R2}}{1 + \frac{R6}{R5}\frac{R1}{R7}}.$$

In terms of the general diagram of FIG. 1 the differential amplifier feedforward path is formed by transistor stage 88 in FIG. 5. Also, the replica feedback path 14 is formed by the transistor stage 94 of FIG. 5 and associated circuit elements.

The signal in the feedforward path emerges with certain undesirable immeasurable effects due to several parametric variations within the elements of the feedforward path. These include signal induced parametric variations on the series coupling capacitors and the transistors; they also include power supply induced variations on the same elements.

The replica feedback path is configured to be similar to the feedforward path; it is powered from the same power supply source 110. Thus the elements in the replica feedback path will undergo the same signal and power supply induced parametric variations as those in the feedforward path. This arrangement yields an output signal substantially free of undesirable immeasurable effects due to parametric variations in the circuit elements. This happens because that output signal component due to the effect of the replica feedback circuit has a nonlinear character that is inverse to that which would be displayed by a signal passing in a forward sense through the replica feedback circuit. Thus when that signal component due to the replica feedback circuit is combined with that signal component due to the feedforward circuit, the undesirable immeasurable effects combine so as to cancel out.

Thus with this stage one can achieve overall voltage gain while still cancelling out the undesirable effects associated with the transistor 88, the power supply 110 and the coupling capacitors 99, 100 which are indeed necessary in the class A stage. However, by use of the techniques described herein, it is possible to correct for the inherent immeasurably small phenomena in many of the elements used in electronic circuits. The advantage of concepts in accordance with the invention is that by accepting the available imperfect elements as they are, it is possible to configure a system which approaches perfection and also allows the use of less expensive elements which may exhibit undesirable phenomena to a greater degree than more expensive elements.

Although different exemplifications and variations in accordance with the invention have been disclosed it will be appreciated that the invention is not limited thereto but encompasses all forms and alternatives coming with the scope of the appended claims.

What is claimed is:

1. The method of restoring to its original form a complex multifrequency input signal waveform which is subject to distortion in an immeasurably small manner through an assembly of active and passive electrical devices displaying the effects of signal and power supply induced parametric variations comprising the steps of:

recreating the parametric variations causing the immeasurably small signal waveform distortions in a replica feedback signal;

comparing the signal waveform to the replica feedback signal to derive a comparison signal representative of the immeasurably small distortions; and generating a feedforward signal responsive to the comparison signal in circuit with the assembly of devices which substantially restores the original form of the complex multifrequency waveform from the replica feedback signal and the distorted signal.

2. The method of claim 1 above, wherein the input signal waveform is passed through the assembly of devices prior to derivation of the comparison signal and the feedforward signal.

3. The method as set forth in claim 1 above, wherein the input signal waveform is altered in an immeasurably small manner in an inverse sense prior to being processed in the assembly of electrical devices.

4. A system for compensating to its original form a complex multifrequency input signal waveform that is processed in a pre-existing active electrical reproduction device which exhibits the effect of distorting the waveform in an immeasurably small manner due to signal and power supply induced parametric variations within that pre-existing device comprising:

means including a set of active and passive devices for replicating in a feedback path the signal and power supply induced parametric variations of the pre-existing device such that the feedback signal contains the immeasurably small distortion due to signal and power supply induced parametric variations;

means for receiving and comparing in a differential manner the input signal waveform to the waveform from the replica feedback circuit to derive a difference signal waveform; and means defining a feedforward path and including means responsive to the difference signal waveform and in circuit with the pre-existing active electrical reproduction device to generate an output signal waveform which is substantially restored to its original waveform state.

5. The invention as set forth in claim 4 above, wherein the system is coupled to immeasurably predistort the complex multifrequency input signal waveform in an inverse sense prior to processing the signal in the pre-existing active electrical reproduction device such that the resultant output signal waveform from the pre-existing device is substantially a faithful reproduction of the original input signal waveform.

6. The invention as set forth in claim 4 above, wherein the system is coupled to immeasurably post distort the signal from the pre-existing active electrical reproduction device such that the resultant feedforward signal is substantially a faithful reproduction of the original input signal waveform.

7. The invention as set forth in claim 4 above, wherein the pre-existing active electrical reproduction device comprises at least one internal active signal device and capacitor element in circuit therewith and wherein the means for replicating comprises a set of elements including means replicating the at least one internal active signal device and capacitor element.

8. The invention as set forth in claim 7 above, wherein the active signal devices are semiconductor elements and the replica feedback circuit comprises an audio amplifier circuit.

9. The invention as set forth in claim 8 above, wherein the audio amplifier circuit comprises a plurality of transistor elements and coupling capacitors in circuit therewith and wherein the means for replicating comprises a like plurality of transistor elements and capacitor elements in circuit therewith.

10. The invention as set forth in claim 4 above, wherein the pre-existing active electrical reproduction device comprises an audio amplifier circuit including a plurality of individual elements whose parameters vary in accordance with applied signal and power supply variations and wherein the means for replicating comprises a like plurality of like individual elements.

* * * * *